(12) United States Patent
Davis et al.

(10) Patent No.: US 11,459,232 B2
(45) Date of Patent: Oct. 4, 2022

(54) ADDITIVE MANUFACTURING METHODS FOR MODIFICATION AND IMPROVEMENT OF THE SURFACES OF MICRO-SCALE GEOMETRIC FEATURES

(71) Applicants: Dennis Willard Davis, Palm Bay, FL (US); Gary James Gaggiani, Vero Beach, FL (US); James Grant Wallin, Terra Ceia, FL (US)

(72) Inventors: Dennis Willard Davis, Palm Bay, FL (US); Gary James Gaggiani, Vero Beach, FL (US); James Grant Wallin, Terra Ceia, FL (US)

(73) Assignee: Donna C. Mauro, Sebastian, FL (US)

( * ) Notice: Subject to any disclaimer, the term of this patent is extended or adjusted under 35 U.S.C. 154(b) by 203 days.

(21) Appl. No.: 16/843,405

(22) Filed: Apr. 8, 2020

(65) Prior Publication Data
US 2020/0317509 A1 Oct. 8, 2020

Related U.S. Application Data (60) Provisional application No. 62/919,995, filed on Apr. 8, 2019.

(51) Int. Cl.
*B82B 3/00* (2006.01)
*B29C 64/245* (2017.01)
*B29C 64/205* (2017.01)
*B81C 1/00* (2006.01)
*B29C 64/135* (2017.01)
(Continued)

(52) U.S. Cl.
CPC .......... *B82B 3/0004* (2013.01); *B29C 64/205* (2017.08); *B29C 64/245* (2017.08); *B81C 1/00373* (2013.01); *B81C 1/00626* (2013.01); *B29C 64/135* (2017.08); *B29C 64/268* (2017.08); *B33Y 10/00* (2014.12); *B82Y 40/00* (2013.01)

(58) Field of Classification Search
None
See application file for complete search history.

(56) References Cited

U.S. PATENT DOCUMENTS

| 2004/0175631 A1* | 9/2004 | Crocker ............. C23C 18/1658 850/16 |
| 2017/0022614 A1* | 1/2017 | Herrmann ............. B60T 8/1703 |
| 2022/0097256 A1* | 3/2022 | Greulich-Weber .... B33Y 40/20 |

OTHER PUBLICATIONS

L. L. Hirt, S. Ihle, Z. Pan, L. Dorwling-Carter, A. Reiser, J.M. Wheeler, R. Spolenak, J. Vörös & T. Zambelli, "Template-Free 3D Microprinting of Metals Using a Force-Controlled Nanopipette for Layer-by-Layer Electrodeposition Advanced Materials," vol. 28, Issue 12, Mar. 23, 2016, pp. 2311-2315.
(Continued)

*Primary Examiner* — Niki Bakhtiari
*Assistant Examiner* — John J DeRusso (57) ABSTRACT

The present disclosure addresses methods to refine the geometry of micro features manufactured in various substrates. Such refinement includes improvement in edge roughness and roughness of aperture channel walls. The methods include deposition of material onto feature edges and surfaces as well as placement of micro fabricated inserts into coarse features. Foremost among the candidate technologies that can be employed for these purposes are two photon polymerization-based 3D nano printing and atomic force microscope nanopipette-based electroplating.

6 Claims, 12 Drawing Sheets

(51) Int. Cl.
*B33Y 10/00* (2015.01)
*B29C 64/268* (2017.01)
*B82Y 40/00* (2011.01)

(56) References Cited

OTHER PUBLICATIONS

Zukauskas, A. et al., "Black silicon: substrate for laser3D micro/nano-polymerization," Optics Express, vol. 21, No. 6, Mar. 25, 2013, pp. 6901-6909.
Rekštytė, S., et al, "Direct laser writing of 3D micro/nanostructures on opaque surfaces," Proc. SPIE 8431, Silicon Photonics and Photonic Integrated Circuits III, May 10, 2012.

* cited by examiner

Prior Art

Fig. 1A

Prior Art

Fig. 1B

Prior Art

Fig. 1C

Prior Art

ADDITIVE MANUFACTURING METHODS FOR MODIFICATION AND IMPROVEMENT OF THE SURFACES OF MICRO-SCALE GEOMETRIC FEATURES

CROSS-REFERENCE TO RELATED APPLICATIONS

This application claims the benefit of U.S. provisional application Patent Application Ser. No. 62/919,995, filed Apr. 8, 2019 for "Additive Manufacturing Methods and Improvement of the Surfaces of Micro-Scale Geometric Features" by Dennis W. Davis, Gary J. Gaggiani, and James G. Wallin.

BACKGROUND

Laser micromachining can be used to create optical apertures such as pinholes, slits and other patterns. Additionally, lasers drilling can be used to create flow orifices for gas flow and microfluidic applications. Laser-based trepanning and laser drilling through substrates such as thin metals, ceramics, polymers, and glass exhibit limits on achievable aperture and feature sizes, the parallelism of feature sidewalls through the depth of the substrate, and rms roughness of the laser machined edges. These limits result from the a) the laser spot size associated with the diffraction limit, b) beam uniformity, c) beam shape, d) beam polarization, e) the stochastic nature of melting and ablating the substrate material, and f) absorptive, diffractive, and refractive interactions of the laser beam with the substrate undergoing laser machining.

There are numerous applications for which it would be beneficial to overcome the aforementioned size and geometry limitations on production of optical pinholes and other features. There are various approaches to creating precision apertures, slits and other patterns that exhibit submicron dimensions, improved geometric precision, and edge roughness values in the range of hundreds down to tens of nanometers and potentially smaller. Among the relevant technologies are direct ink writing, selective laser melting, projection micro stereolithography, two-photon polymerization (2PP) direct laser writing (DLW), electrical discharge machining (EDM), etc.

However, the resolution of these additive manufacturing (AM) approaches implies a lengthy production time required to make parts approaching even a millimeter in dimension. Hence, what is needed is a method to produce precision geometric edges without the requirement to print volumes of material that require large amounts of time.

BRIEF SUMMARY OF THE INVENTION

The use of AM in concert with laser machining in a way that achieves rapid production of precision features is disclosed. A preferred method comprises first, the formation of a coarse void using laser machining followed by use of AM to refine the edge or three-dimensional surface of the void through precision deposition of material around the void. This method achieves precision geometries with small edge roughness in a way that minimizes the employment of the AM deposition and the attending time required. For example, use of AM alone to create a one micron pinhole with tens of nanometers resolution and exhibiting adequate surround to support the feature may take hours. In contrast, the use of a laser to create an initial coarse pinhole and subsequent addition of material around the pinhole to create a precision pinhole edge by AM can take but seconds or minutes.

The present method addresses not only the resolution limitations of laser machining, but also phenomena deleterious to feature formation. Laser trepanning or drilling often results in some irregularity of the intended geometry due to the stochastic nature of laser melting, evaporation, and ablation of the substrate as well as material oxidation and condensation. Also, laser machining can create a depth-tapered excavation of substrate material as well as regions of slag or dross about the feature on the laser exit face of the substrate.

In optical applications of aperture features such as pinhole spatial filtering, or apodization, the feature edge of most importance is that on the laser exit face of the substrate enclosing the aperture at the laser exit plane of the laser. This is the edge (aperture contour) associated with a two-dimensional projection of the aperture onto a plane perpendicular to the surface of the substrate. Again, because of the depth-tapered nature of the laser-machined feature, the aperture "channel" at the laser exit surface exhibits the smallest cross-sectional dimensions. Hence, the contour of the aperture in this plane can be considered the "optical edge." In the case of metal substrates, this edge may exhibit pronounced irregularity due to the aforementioned causes. In addition to the tapering of the aperture channel, cross-sectional irregularity of this channel will be present. The magnitude of these phenomena is governed by multiple factors that include the laser wavelength, pulse energy, pulse width, pulse repetition rate, polarization and the nature of the substrate material itself, etc. Improvement of the geometry of the optical edge of the aperture and the aperture channel can be achieved with AM deposition of material along the optical edge and along the length of the aperture channel, respectively.

To implement the methods herein disclosed, two premier candidate tools for performing AM in micro geometries include direct laser writing (DLW) and microfluidic material deposition.

The following definitions serve to clarify the disclosed and claimed invention:

Feature describes a geometric entity that is placed in a supporting material volume. It can be characterized as a three-dimensional shaped void, protrusion, or combination of void and protrusion.

Coarse feature refers to a feature that first is created by any number of processes such as laser machining, photolithography, EDM, etc. that is subject to improvement in its geometry. Such improvement includes reduction in roughness of edges, increased shape fidelity, or modification of the geometry to optimize specific functionality of the feature in applications such as fluidics, filtration, electromechanics, optics, etc.

Optical edge refers to inner profile of a two-dimensional projection of an aperture along an axis perpendicular to the plane of the substrate in which the aperture is present.

Improvement in geometry refers to any change in the geometry of a feature that renders it a more faithful representation of a desired pattern along one or more dimensions. Examples would be the improvement in the circularity or edge roughness of the optical edge of a pinhole.

Aperture or feature channel refers to an aspect of features that are designed to be cylindrical with a specific cross sectional pattern (circular, rectangular, or an arbitrary closed curve). Channels are formed by the sidewalls of the feature that extend through the thickness of the feature cut. Features penetrating through the full thickness of a thin sheet may exhibit sidewalls that taper into the depth of the cut or vary in other ways with the depth of the cut.

Micro machined refers to use of any number of technologies to create features in substrates that are characterized by dimensions ranging from nanometers to micrometers.

DETAILED DESCRIPTION AND BEST MODE OF IMPLEMENTATION

The present disclosure provides a methodology for creating very high precision micro features in a substrate in a timely and cost-effective manner. More specifically, the use of AM techniques to modify and improve the surfaces of features that are rapidly produced by such means as laser machining are disclosed.

Micro features exhibiting precision geometries have utility in fluidics, biomedicine, micromechanics, and optics. In the case of optical applications, diffraction considerations are important and place constraints on the geometric irregularity of the two-dimensional illumination exit aperture of the feature, the edge roughness of the feature, and possibly on the irregularity of the aperture channel.

Laser micromachining can be used to produce small features in glass, ceramics, polymers, or metal substrates in relatively short time. However, as previously discussed, the edge roughness and surface quality of such features may fall short of requirements for given applications. Once a coarse version of a feature is rendered in a substrate by laser machining or other means, an AM device is employed to modify the feature and improve its geometry. AM tools are exploited in such a way as to circumvent the long times traditionally associated with their use for a single task.

Candidate AM Tools

In preferred embodiments of the present methods, the AM tools identified are 3D micro printers that use photo polymerization and microfluidic deposition, respectively. However, other 3D micro printing technologies are within the scope the presently disclosed invention.

Figure 1A:
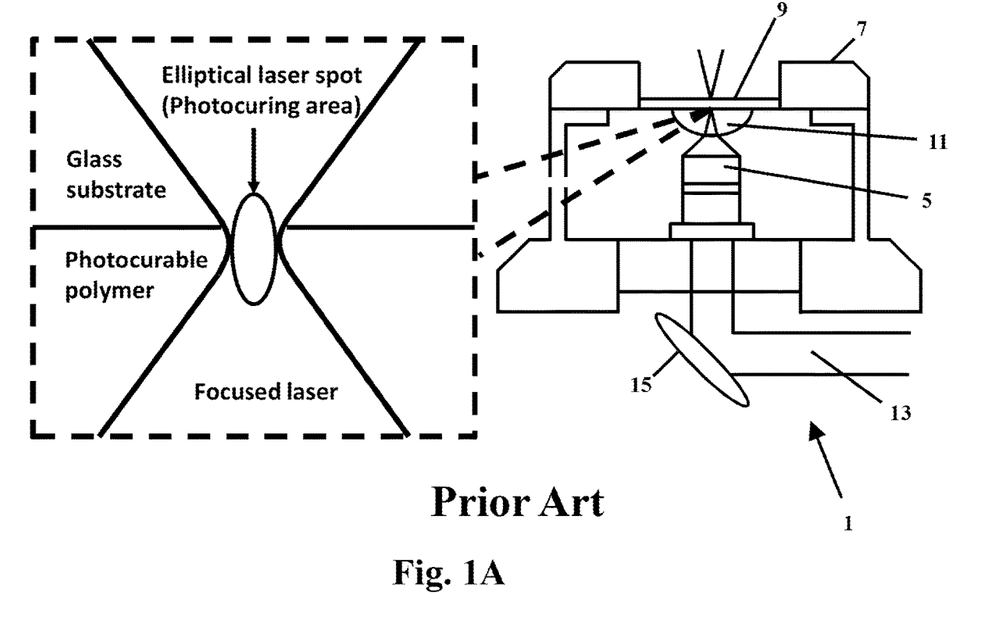
FIG. 1A is a schematic diagram of a two-photon polymerization-based micro printer.
Figure 1B:
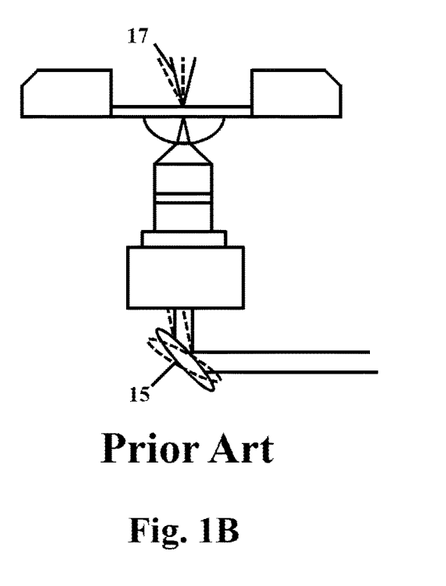
FIG. 1B is a schematic diagram of a variant of the printer of FIG. 1A which employs a galvo mirror.
Figure 1C:
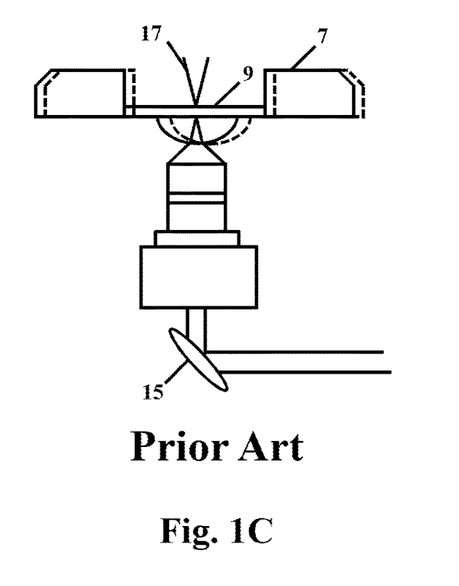
FIG. 1C is a schematic diagram of a variant of the printer of FIG. 1A which employs a translation stage.

A first 3D micro printer candidate, which utilizes two-photon polymerization (TPP), comprises the Photonic Professional GT2, manufactured by Nanoscribe GmbH, of Eggenstein-Leopoldshafen, Germany. In this printing process, a laser exposes a photosensitive resin by means of a high-numerical aperture objective along a trajectory and layer-by-layer following a CAD design. The material solidifies only in the laser focus allowing to additively build up nearly arbitrary 3D structures with submicron features. The focused laser spot is either scanned by galvanometer or the photo sensitive substrate is translated under precision control of piezoelectric actuators. The resolution and voxel size are mainly determined by the laser spot size in the material, the power of the laser source and the properties of the photosensitive material itself. By using focusing optics with a high numerical aperture, very small voxels with sub-micrometer dimensions can be achieved. FIG. 1A depicts the functionality of a first variant of the system that moves the substrate. The system 1 comprises a z-axis stage 3 for objective lens 5 and an xyz precision piezo stage 7 that moves the substrate 9 on which is deposited a volume 11 of photocurable polymer. A femtosecond infrared laser beam 13 is introduced by mirror 15 into the objective lens 5. A focal spot is formed at a particular z location in the volume 11 of polymer determined by the focal length of the objective lens 5 and the position of the z-axis stage 3. Polymerization of the photocurable polymer with volume 11 occurs only at the position of the laser focal spot which exhibits an energy density above the polymerization threshold. Stages 3 and 7 are under computer control so as to build a polymerized structure within volume 11 in z layer-by-layer fashion in accordance with the CAD model of the desired structure. Upon completion of the polymerization task, the uncured volume of photopolymer is removed from the structure by solvent means. The distinction between the two variants of the system are highlighted in FIGS. 1B and 1C. In FIG. 1B, the mirror 15 is shown to be a galvanometer mirror that steers the beam 17 laterally in lieu of stage motion. The mirror 15 is shown to be a fixed mirror in the variant of the system depicted in FIG. 1C. Here, the beam does not move laterally, rather stage 7 does as discussed relative to FIG. 1A. Not depicted is the provision (which is present) for determining the location of the interface between the given substrate and the photocurable polymer using an optical sensor. Additionally, an imaging modality permits monitoring the formation of the polymerized structure.

Figure 2:
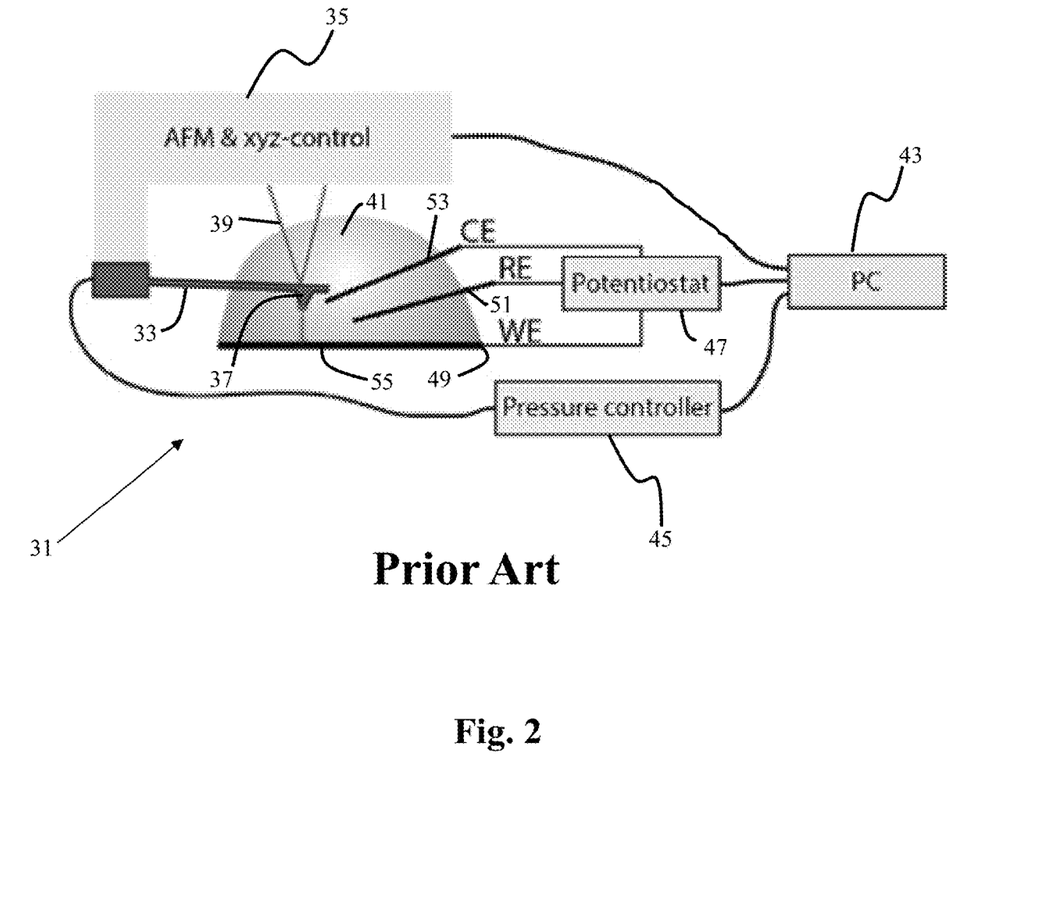
FIG. 2 is a schematic diagram of micro printer that employs an atomic force microscope nanopipette for electrodeposition.

A second 3D micro printer candidate results from a fusion of two technologies, microfluidics and force microscopy (L. L. Hirt, S. Ihle, Z. Pan, L. Dorwling-Carter, A. Reiser, J.M. Wheeler, R. Spolenak, J. Voros & T. Zambelli, "Template-Free 3D Microprinting of Metals Using a Force-Controlled Nanopipette for Layer-by-Layer Electrodeposition Advanced Materials," Vol. 28, Issue 12, Mar. 23, 2016, pp. 2311-2315.). The device, FluidFM µ3Dprinter, produced by Cytosurge AG, Glattbrugg, Switzerland, can print submicron voxels of metal by local electroplating. Reference is made to FIG. 2 in discussion of the system operation of atomic force microscope 31. An atomic force microscope (AFM) cantilever (nanopipette) 33 is immersed in a three-electrode electrochemical cell containing a quasi-reference electrode 51 and a platinum counter electrode 53, and of course the working electrode 49 (that is in contact with electrically-conductive substrate 55) governed by a potentiostat 47, well known in the electroanalytical prior art. The cantilever 33 is filled with a metal salt solution (ex CuSO4) whose flow from the probe 37 is precisely controlled by a pressure controller 45. The probe position is monitored by a conventional AFM laser return 39 as a function of position controller 35. The operation of controller 35, potentiostat 47, and pressure controller 45 all are governed by process control computer 43. The probe tip is used as a local source of metal ions in a macro-electrochemical cell containing a supporting electrolyte 41: if the tip is brought to a surface having a sufficiently high cathodic potential, the metal ions exiting the aperture of the probe are reduced locally, resulting in confined metal electroplating under the probe tip. The deposit size is confined by the diffusion profile of the metal ions. Each metal voxel is deposited until the voxel metal touches the probe tip causing a deflection sensed by the AFM laser return 39. As the touching event is recognized, the next position is approached and growth continues with a new voxel. During the whole deposition process, the over-pressure is kept at a constant value.

Feature Geometry Modification Methods Employing AM Tools

Figure 3:
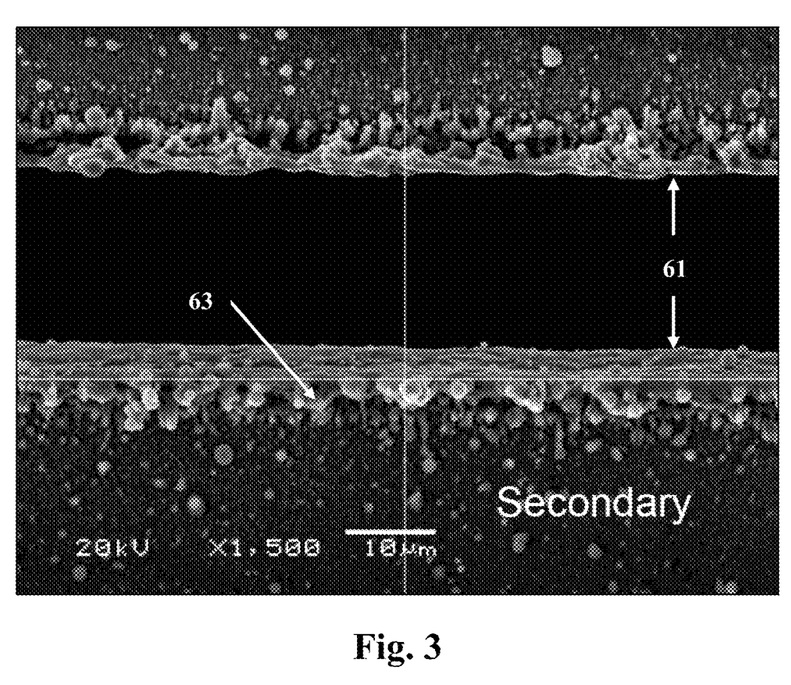
FIG. 3 is a scanning electron microscope (SEM) photomicrograph of a laser machined slit with slag deposits along the edges.
Figure 4:
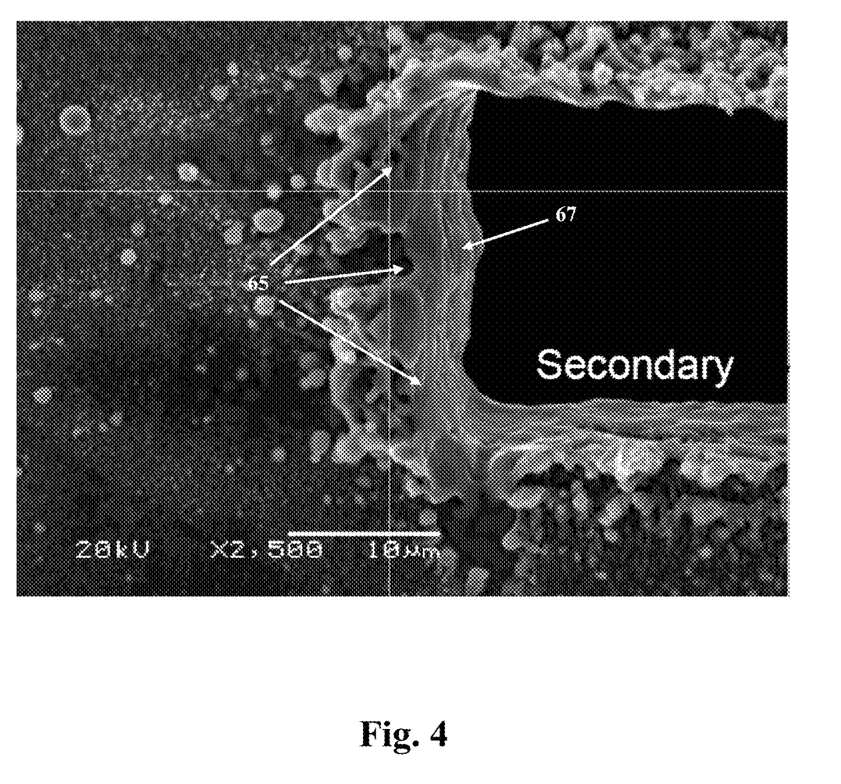
FIG. 4 is an SEM photomicrograph of the end of a laser machined slit.

The nature of the substrate feature surfaces produced by laser machining can be examined with reference to FIGS. 3-6. These are scanning electron microscope (SEM) photomicrographs of features laser machined into stainless steel foil. Each of these depict the machining laser exit face of the respective substrate. FIG. 3 is an image of a slit 61 approximately 20 microns in width. The kerf exhibits accumulation of globular slag deposits 63 along the slit edge. In FIG. 4, the geometry of the kerf 65 at the end of a slit may be examined to include some indication of the roughness 67 of the sidewalls of the slit channel. The 50 micron diameter pinhole 71 of FIG. 5 exhibits radial depositions of slag 73 and an enlarged edge of this aperture shows rings of globular deposits 81 in FIG. 6. In these examples, the globules of condensed metal adjacent the laser machined feature can reach 3 to 4 microns in diameter. The presently-disclosed methods of refining laser machined edges and surfaces must accommodate this topology in such a way as to maintain registration and orientation of the improved geometry.

The TPP AM tool appears to be the most versatile device for implementation of feature geometry modification methods. The use of AFM nanopipette electrodeposition is an alternative that is subject to geometric constraints on the approach of the pipette to the feature, but would be operated to create voxel deposits of material using the same deposition trajectories as for TPP. The methods of this disclosure first will be described using the TPP AM tool. In general, the various methods of implementing feature geometry modification may be categorized as follows:

1. 3D printing onto the surround of the feature
   a. Printing an "edge" (method A)
   b. Printing a "channel" (method B)
2. Creation of an insert for placement in the feature
   c. Standalone creation of the insert (method C)
   d. Molding of the insert (method D)

Figure 5:
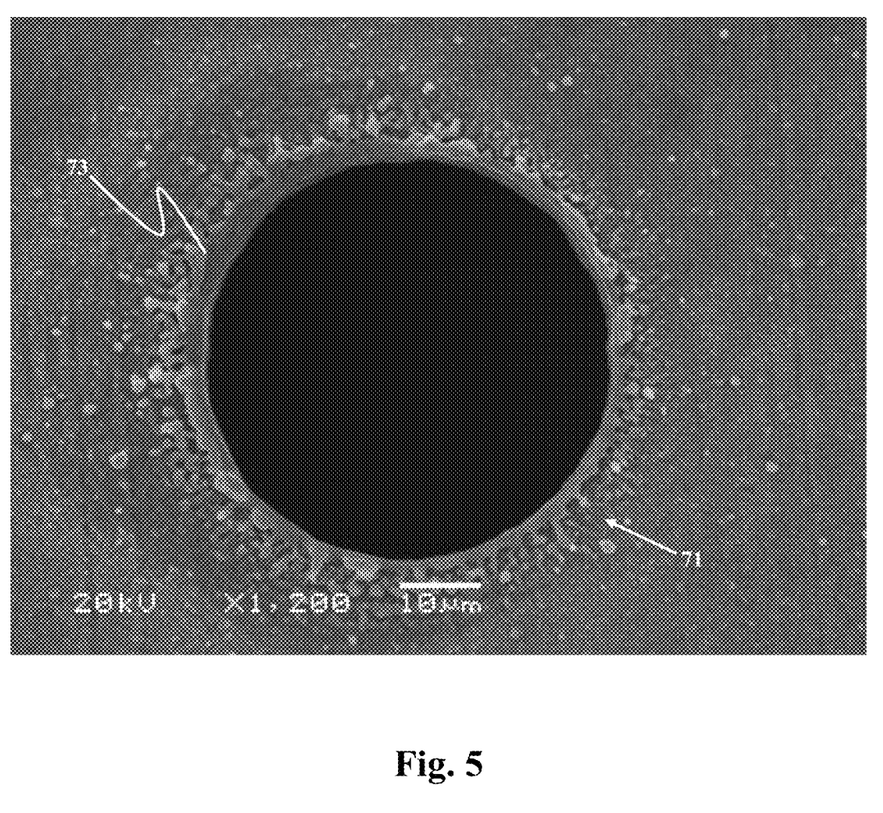
FIG. 5 is an SEM photomicrograph of a laser machined round aperture.
Figure 6:
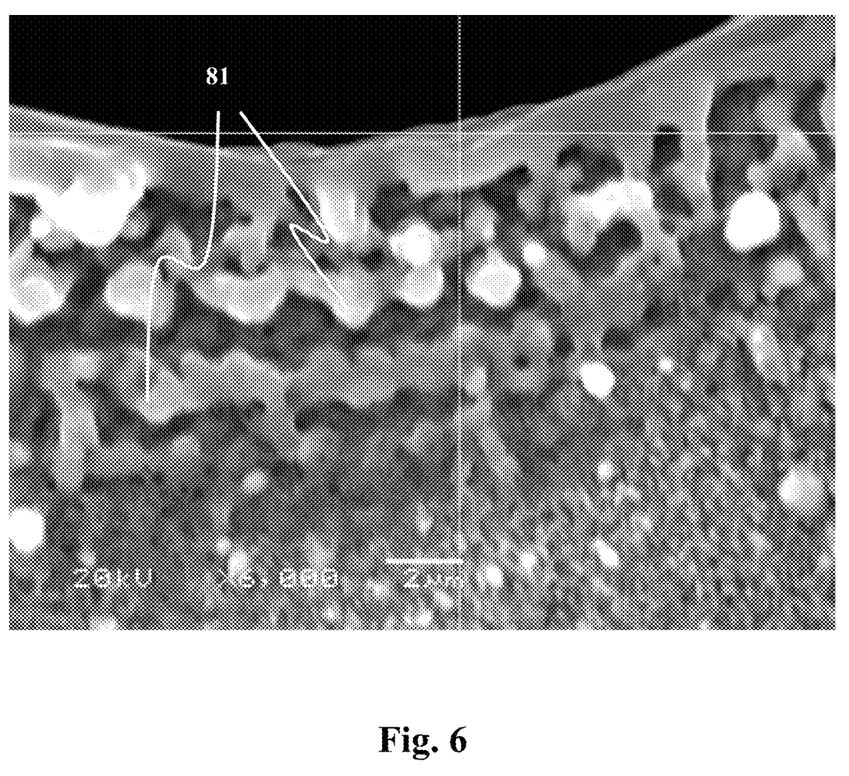
FIG. 6 is an enlargement of an edge of the aperture of FIG. 5 depicting rings of globular deposits.
Figure 7:
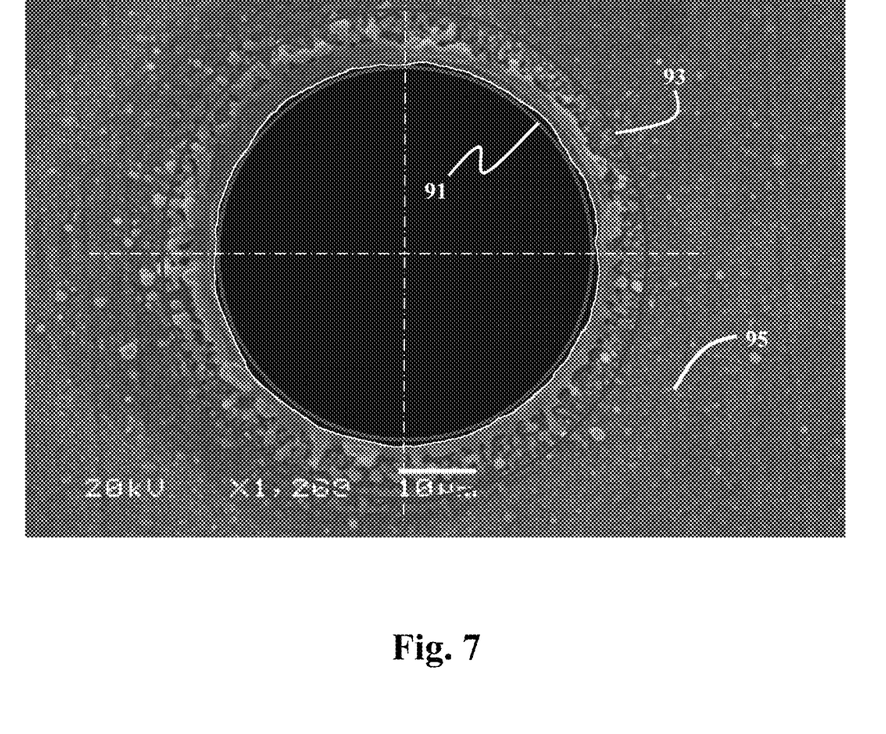
FIG. 7 is the image of FIG. 5 with geometric overlays.

The pinhole of FIG. 5 is used as an example rough feature that can be refined by method A or B. Hence, reference is made to FIG. 7 which is an image of the pinhole with overlay 91 which is a circle inscribing the feature geometry and overlay 93 which is a circle designating the proposed radial extent of feature modification. Method A involves depositing material upon the surface of the substrate 95 within the region bounded by overlays 91 and 93. The use of TPP for this feature modification in accordance with method A is explained with reference to FIG. 8A, providing a cross sectional view of the aperture 101. Shown is substrate 95 with the aperture in cross section, comprising the body of the substrate 103, aperture channel walls 107, and void 105. A multilayer TPP deposition of material 115, comprising individual layers 113, is shown confined as an annular cylinder, as depicted in FIG. 8B. These layers 113, exaggerated in thickness for ease of viewing, are confined between the edges 111 and 109, corresponding to the inner and outer overlays of FIG. 7, respectively. Edge 111 serves as the refined circular edge of the aperture feature. Deposition geometries other than the annular cylinder can be used to achieve the objective of the precision inner circular edge, for example the outer perimeter could be multi-sided or a non-circular contour. Obviously, for non-circular features exhibiting apertures with cross sections that are ellipses, square, rectangles and arbitrary shapes, the inner contour of the deposited material will reflect these geometries. Nevertheless, in order to minimize the time necessary to achieve the feature modification, the volume associated with this modification region should be minimized subject to minimum thickness for robustness and the minimum radial extent necessary for adequate adhesion of the feature modifying deposition.

Figure 8A:
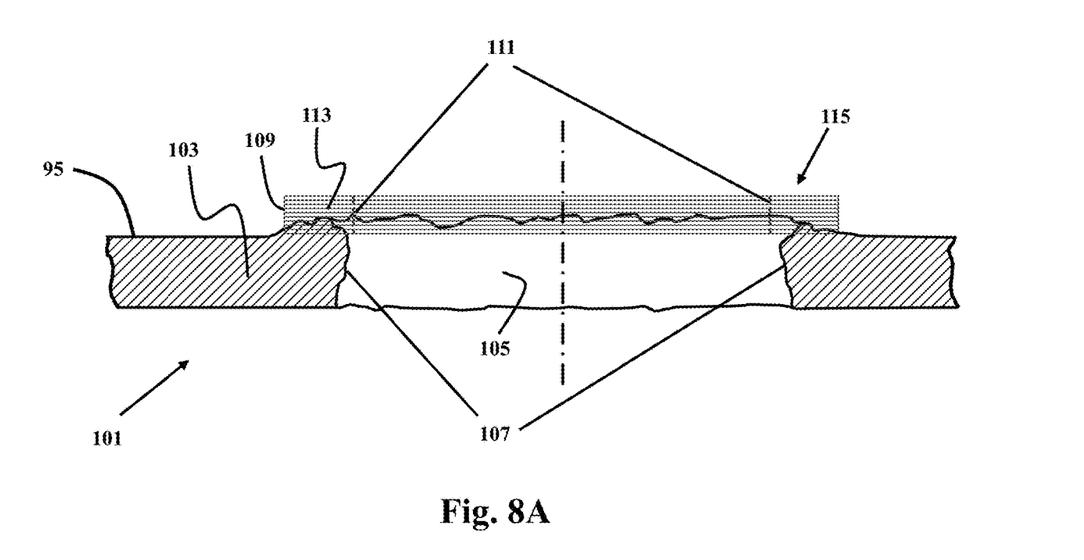
FIG. 8A is cross sectional diagram of the aperture of FIG. 5 depicting deposition of polymer for edge improvement.
Figure 8B:
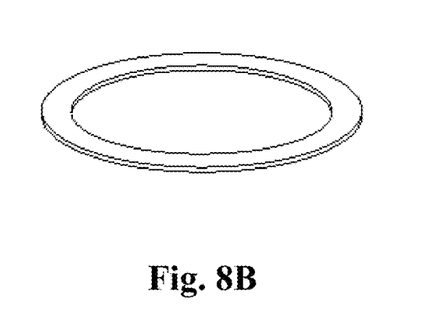
FIG. 8B is pictorial diagram of the polymer geometry of FIG. 8A.
Figure 9A:
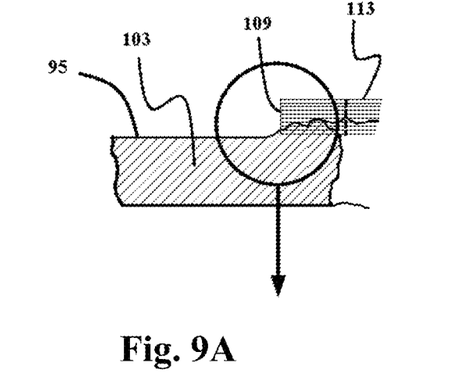
FIG. 9A is a reproduction of one edge of the aperture of FIG. 8A.
Figure 9B:
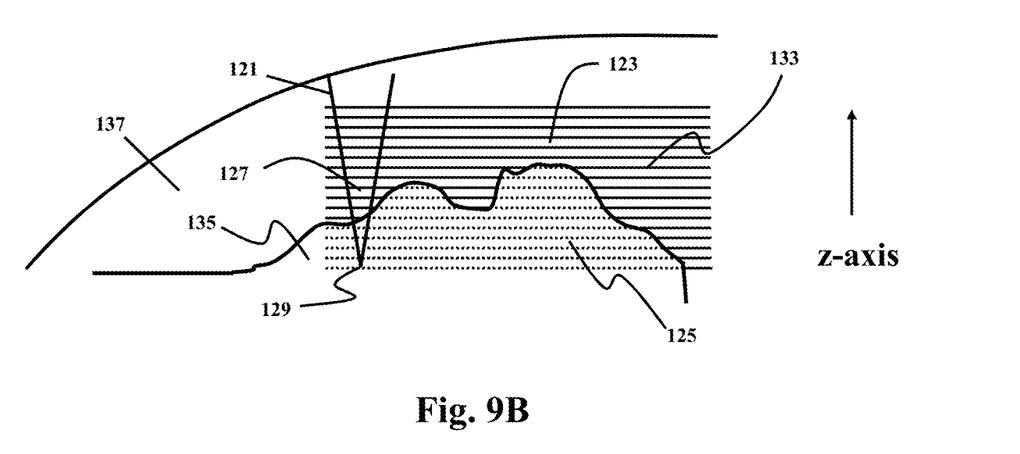
FIG. 9B is a cross section diagram of the polymer deposition process highlighting non-polymerization.
Figure 9C:
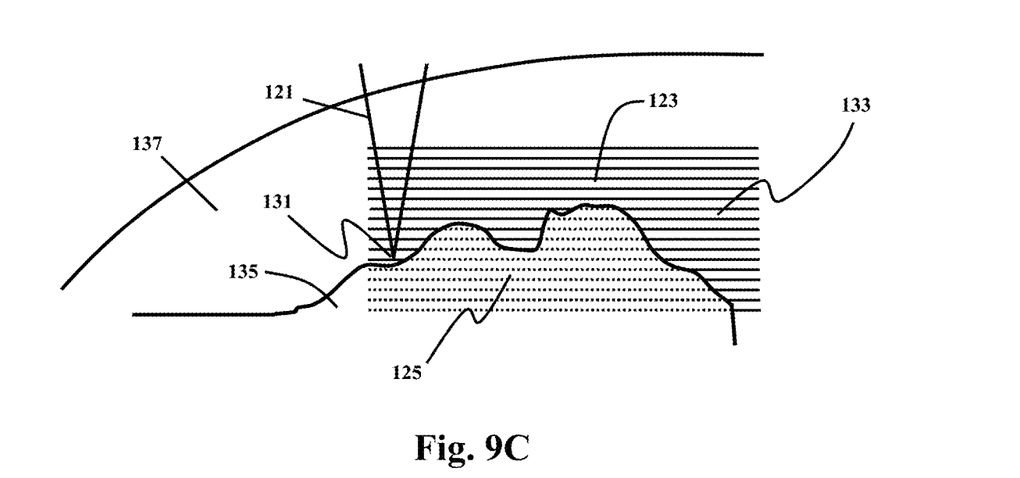
FIG. 9C is a cross section diagram of the polymer deposition process highlighting polymerization.

One edge of the aperture of FIG. 8A is reproduced for ease of reference in FIG. 9A with expanded detail of this edge shown in FIGS. 9B and 9C for description of the TPP process of modifying the edge. In FIGS. 9B and 9C the part is immersed in photopolymerization liquid 137 and depicted are the multilayer trajectories 133 of the TPP focused beam 121 within this liquid. These trajectories represent lateral scanning of the focused beam 121 to cover an x-y plane perpendicular to the annotated z-axis at multiple, sequential high resolution steps along the z-axis. These trajectories result in regions 123 of polymerization and regions 125 lacking polymerization. The focused beam 121 of FIG. 9B is shown exhibiting unfocused light 127 in the region above the substrate 135 resulting in no polymerization at any location along the beam since the location 129 of the focal spot would have been below the surface of the substrate 135. In contrast, FIG. 9C indicates that when the focal spot of the focused beam 121 is at a location 131 within the polymerizable liquid 137, polymerization does occur. In this way, the liquid is polymerized around arbitrary substrate topologies. Centration of the deposition volume with respect to the desired datums or optical axis of the aperture feature is facilitated with the imaging modalities of the Nanoscribe device.

One issue to be addressed with regard to the conditions of FIG. 9B concerns back reflection of the unfocused beam from a specular planar or concave surface on the substrate that might result in the focal spot of the reflected beam appearing above the substrate. In a worst case scenario of ideal specular reflection, this could result in small spots of polymerized material floating within the liquid above the substrate that could interfere with polymerizing the liquid at z-axis locations below such beam obstructions. Fortunately, the laser machining surface of the substrate is highly irregular and non-specular owing to geometry, oxidation, and other effects.

Figure 10A:
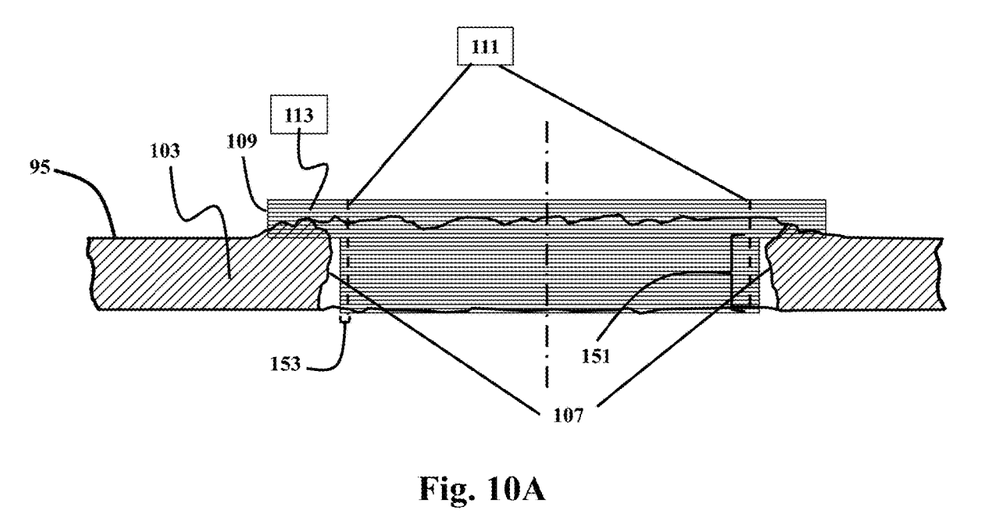
FIG. 10A is cross sectional diagram of the aperture of FIG. 5 depicting deposition of polymer for creation of a channel in the aperture.
Figure 10B:
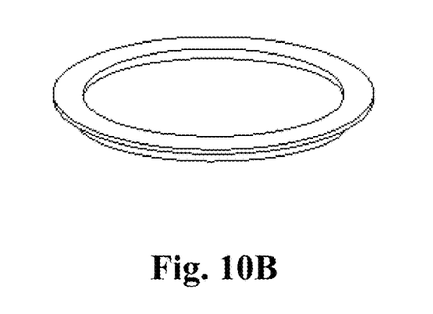
FIG. 10B is a pictorial diagram of the polymer geometry of FIG. 10A.

FIGS. 10A and 10B depict the implementation of method B using TPP. Herein, a precision cylindrical channel is created within the coarse aperture. The aperture geometry of FIG. 8A repeated in FIG. 10A includes an extension of the deposition layers 113 to include a channel region 151 exhibiting a thin wall 153. The resulting flange geometry for the deposition is seen in FIG. 10B. In this application, the layers must be deposited from the bottom upward. It is understood that right cylindrical channel geometries of arbitrary cross section can be manufactured in this way; further, tapered and variable taper channels can be created. The coarse, laser-machined aperture can be created with a counter-sunk geometry so that polymer flange can be lowered into the metal creating less of a protrusion above the surface of the metal.

In addition to limiting the lateral and top boundaries for the volume of polymerization, another prospect for minimizing the overall deposition time is to limit scanning time through volumes that will not be polymerized. This can be achieved to some extent by detecting the liquid-substrate interface using the autofocus mechanism of the Nanoscribe device (Nanoscribe Photonic Professional (GT) User Manual, 2015) at key positions of the substrate topology and scanning the focused beam accordingly.

The creation of polymerized structures on reflective surfaces is problematic since reflection alters 3D micro/nano-structuring of polymers in the vicinity of the polymerization volume. This is understandable since the narrow window of irradiances/fluences suitable for polymerization by DLW is already very close to the dielectric breakdown threshold. Hence, minor intensity augmentation due to interference or inhomogeneity of absorption in the resist drives catastrophic explosion due to breakdown. This can be mitigated by a) using optical photoresists tailored for lower laser intensities, b) using multiple DLW scans at lower power, c) reducing refractive index mismatch between the photoresist and the substrate, d) reducing the reflectivity of the substrate, e) using an adhesion material layer between the substrate and the photoresist (Zukauskas, A. et al., "Black silicon: substrate for laser3D micro/nano-polymerization," OPTICS EXPRESS, Vol. 21, No. 6, Mar. 25, 2013, pp. 6901-6909.). Variations in implementation will obtain depending on the mode of DLW used, whether or not oil immersion coupling of the laser light is employed. Reducing reflectivity of the substrate can be accomplished by surface processing (ex. chemical etching, EDM, laser texturing, etc.) or coating (ex. PVD, CVD, plating, use of dyes or paints, etc.). In cases where blackening of the metal surface is required, blackening of the substrate need only occur in the vicinity of the region that will support DLW polymerized structures.

Additionally, rough and contaminated surfaces offer challenges to good adhesion of the polymerized structure. It is important that removable contamination be eliminated from the substrate surface. For example, when laser machining in air, stainless steel kerfs will exhibit chrome oxide slag as well as some possible carbonization due to handling contamination. Removal of organics and loosely adhering laser machining byproducts can be achieved by chemical and ultrasonic means well known in the prior art. Adhesion of the polymerized structure to the substrate can be improved with the use of an adhesion promotor such as MAPTMS (methacryloxyporpyltrimethoxysilane) or other silane. A monomolecular or thicker adhesive layer is formed by immersion (Rekštytė, S., et al, "Direct laser writing of 3D micro/nanostructures on opaque surfaces," Proc. SPIE 8431, Silicon Photonics and Photonic Integrated Circuits III, 10 May 2012.)

There are a number of materials considerations for these methods which include the actual TPP liquid formulations as well as materials that can be used to overcoat the deposited material. With respect to the TPP liquid, prior art demonstrates the use a wide range of materials that have been validated successfully for DLW with different optical, mechanical, electronic and chemical/biological properties. Along the list of compatible resins are standard photopolymers as used in semiconductor industry. Biocompatible materials and hydrogels can also be used for 3D structuring. Formulations can be optimized to maximize performance with respect to resolution or deposition speed. Polymer structures can be deposited on a large range of substrates with different chemical and physical properties. The deposited structure can be coated with other materials such as ceramics, metals, etc. by means of atomic layer deposition, chemical vapor deposition, plasma vapor deposition, galvanization, and electroless plating, among others.

Figure 11:
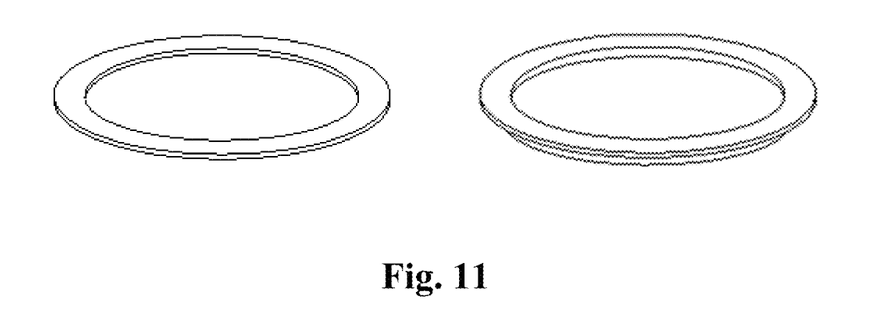
FIG. 11 comprises pictorial diagrams of standalone parts created by polymer deposition.
Figure 12:
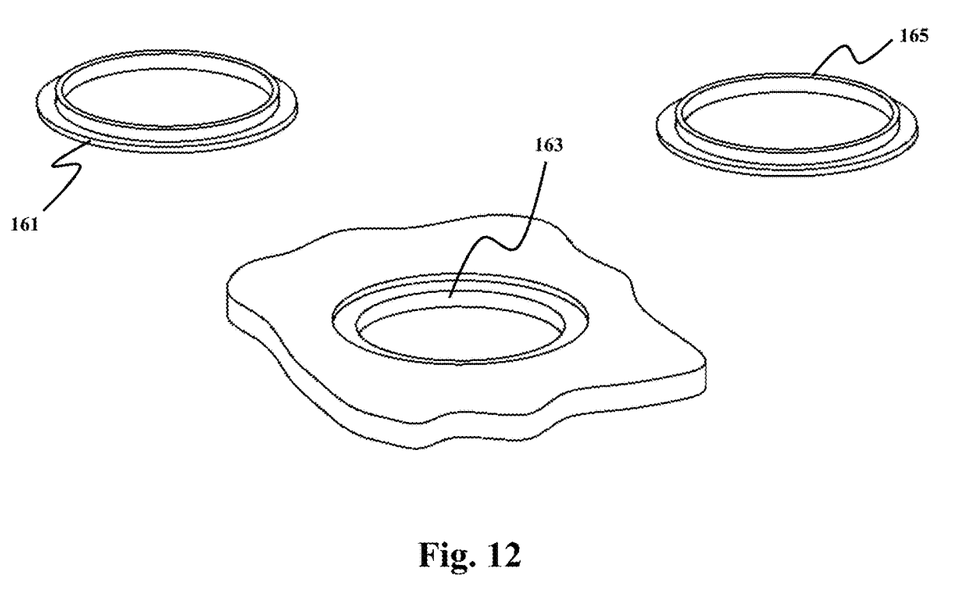
FIG. 12 comprises pictorial diagrams of a mold master, mold, and replicated part.

FIG. 11, depicting the previously discussed deposition geometries for a round aperture, represents method C which involves standalone deposition of "parts" which subsequently can be installed in the coarse aperture. Micro manipulation techniques, well known in the prior art (semiconductors and microbiology), can be used to install these parts with adhesives such as photocurable or thermally curable compounds. A final alternative method (D) for the creation of refined aperture geometries comprises the use of AM to make micro molds for these insertable parts. TPP can be used for the fabrication of high-precision masters with a replicable surface topography. An example is the TPP creation of a master for the flange 161 of FIG. 12. It can be cast into polydimethysiloxane resist. This negative copy 163 is used as a stamp to create a replica 165 of the original flange structure.

What is claimed is:

1. A method of refining the geometry of micro machined features comprising the steps of:
   a) creating a coarse feature in a substrate by laser micro machining, the coarse feature characterized by penetration of the full thickness of the substrate and exhibiting at least one edge and/or surface that can be geometrically improved;
   b) undertaking micro deposition of material to improve the at least one edges and/or surfaces associated with the coarse feature.

2. A method as claimed in claim 1 wherein step b further comprises using two-photon polymerization to deposit a refined edge or channel.

3. A method as claimed in claim 1 wherein the substrate exhibits a lateral surface in proximity to the coarse feature and the coarse feature exhibits a channel through the full thickness of the substrate, the micro deposition of material occurring along the lateral surface of the substrate and along a direction into the coarse feature depth.

4. A method as claimed in claim 1 wherein the at least one edges and/or surface is geometrically improved by increasing the fidelity of the at least one edge and/or surface to an intended geometry.

5. A method as claimed in claim 1 wherein the at least one edges and/or surfaces is geometrically improved by decreasing their roughness.

6. A method as claimed in claim 1 wherein the substrate is a planar material exhibiting a top planar surface which serves as a reference plane, the at least one edge and/or surface is geometrically improved so as to improve the contour of a two dimensional projection of the coarse feature perpendicular to the reference plane onto a plane parallel to the reference plane.

\* \* \* \* \*